US011201397B2

(12) United States Patent
Kaho et al.

(10) Patent No.: US 11,201,397 B2
(45) Date of Patent: Dec. 14, 2021

(54) CIRCUIT AND WIRELESS DEVICE

(71) Applicant: NIPPON TELEGRAPH AND TELEPHONE CORPORATION, Tokyo (JP)

(72) Inventors: Takana Kaho, Tokyo (JP); Doohwan Lee, Tokyo (JP); Hirofumi Sasaki, Tokyo (JP); Yasunori Yagi, Tokyo (JP); Takashi Shimizu, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/978,146

(22) PCT Filed: Feb. 26, 2019

(86) PCT No.: PCT/JP2019/007403
§ 371 (c)(1),
(2) Date: Sep. 3, 2020

(87) PCT Pub. No.: WO2019/172026
PCT Pub. Date: Sep. 12, 2019

(65) Prior Publication Data
US 2021/0044014 A1 Feb. 11, 2021

(30) Foreign Application Priority Data
Mar. 8, 2018 (JP) .............................. JP2018-042430

(51) Int. Cl.
*H01Q 1/52* (2006.01)
*H01P 3/08* (2006.01)
(Continued)

(52) U.S. Cl.
CPC ............. *H01Q 1/526* (2013.01); *H01P 3/081* (2013.01); *H01P 5/16* (2013.01); *H03F 3/19* (2013.01);
(Continued)

(58) Field of Classification Search
CPC .......... H01Q 1/526; H01Q 3/26; H01P 3/081; H01P 5/16; H01P 5/02; H03F 3/19;
(Continued)

(56) References Cited

U.S. PATENT DOCUMENTS 6,104,935 A 8/2000 Smith et al.
7,352,325 B1 4/2008 Floyd et al.
(Continued)

FOREIGN PATENT DOCUMENTS

CN 1441979 A 9/2003
CN 1703829 A 11/2005
(Continued)

OTHER PUBLICATIONS

I. E. Telatar, "Capacity of Multi-antenna Gaussian Channels", European Transactions on Telecommunications, vol. 10, pp. 585-595, 1999.
(Continued)

*Primary Examiner* — Fitwi Y Hailegiorgis
(74) *Attorney, Agent, or Firm* — Harness, Dickey & Pierce, P.L.C.

(57) ABSTRACT

A circuit includes a first input and output terminals to which a current, a voltage, or an electromagnetic wave (referred to as "current or the like" below) is applied, a second input and output terminals to which the current or the like is applied, a first board including a matrix circuit which is formed by a first line and includes a 90-degree hybrid circuit and a delay line, the first line in which one end is connected to the first input and output terminals and a tip of the other end is
(Continued)

opened, a second board including a second line in which one end is connected to the second input and output terminals, and a tip of the other end is opened, and a shielding plate including an opening portion.

7 Claims, 16 Drawing Sheets

(51) Int. Cl.
*H01P 5/16* (2006.01)
*H03F 3/19* (2006.01)
*H04B 1/04* (2006.01)
*H03K 5/00* (2006.01)

(52) U.S. Cl.
CPC ..... *H04B 1/0483* (2013.01); *H03F 2200/451* (2013.01); *H03K 5/00* (2013.01); *H03K 2005/00013* (2013.01)

(58) Field of Classification Search
CPC .. H03F 2200/451; H04B 1/0483; H03K 5/00; H03K 2005/00013
USPC ........................................................ 375/267
See application file for complete search history.

(56) References Cited

U.S. PATENT DOCUMENTS

| 2004/0038714 | A1 | 2/2004 | Rhodes et al. |
| 2006/0262475 | A1 | 11/2006 | Katsumata et al. |
| 2009/0086655 | A1* | 4/2009 | Ghadaksaz ........ H04B 7/15542 370/293 |
| 2012/0294388 | A1 | 11/2012 | Choi et al. |
| 2017/0207516 | A1* | 7/2017 | Koo .......................... H01Q 9/42 |

FOREIGN PATENT DOCUMENTS

| CN | 102684611 A | 9/2012 |
| CN | 102792654 A | 11/2012 |
| JP | H09298409 A | 11/1997 |
| JP | 2001523425 A | 11/2001 |
| JP | 2010515380 A | 5/2010 |
| WO | WO-9850981 A1 | 11/1998 |

OTHER PUBLICATIONS

R. Kataoka, et al. "Analog Decoding Method for Simplified Short-Range MIMO Transmission," IEICE Trans. Commun., vol. E97-B, No. 3, Mar. 2014.
Araki et al., OAM as a New Spatial Multiplexing Concept, IEICE, vol. 100, No. 8, pp. 854-858, Aug. 1, 2017.
B. Palacin et.al, "An 8x8 Butler Matrix for Generation of Waves Carrying Orbital Angular Momentum (OAM)" The 8th European Conference on Antennas and Propagation (EuCAP 2014) pp. 2814-2818, 2014.
B. Cetinoneri et.al, "An 8x8 Butler Matrix in 0.13μm CMOS for 5-6-GHz Multibeam Applications" IEEE Transactions on Microwave Theory and Techniques, vol. 59, No. 2, Feb. 2011.

* cited by examiner

CIRCUIT AND WIRELESS DEVICE

CROSS-REFERENCE TO RELATED APPLICATIONS

This application is a 371 National Stage of International Application No. PCT/JP2019/007403, filed on Feb. 26, 2019, which claims priority to Japanese Patent Application No. 2018-042430, filed Mar. 8, 2018. The entire disclosures of the above applications are incorporated herein by reference.

TECHNICAL FIELD

The present disclosure relates to a circuit and a wireless device.

BACKGROUND ART

As one method of realizing high speed transmission, there is a Multiple-input and multiple-output (MIMO) transmission technology. FIG. 13 is a diagram illustrating a specific example of a configuration of a MIMO transmission and reception system 900 realizing the MIMO transmission technology. The MIMO transmission and reception system 900 includes transmission antenna arrays 911-1 to 911-N (N is an integer of 1 or more), transmitters 912-1 to 912-N, reception antenna arrays 913-1 to 913-N, and receivers 914-1 to 914-N. In the MIMO transmission and reception system 900, it is possible to perform high speed transmission by performing instantaneous weighting processing on both the transmitter and the receiver based on channel information (Non-Patent Literature 1).

As one method of realizing high speed transmission in an environment such as a line-of-sight environment, in which a channel is changed little, there is a simple multi-stream transmission method using a fixed weight. In the simple multi-stream transmission method using a fixed weight, analog channel orthogonalization is performed using a 90-degree phase shifter (Non-Patent Literature 2). Such a simple multi-stream transmission method using a fixed weight uses the fixed weight by an analog power supply circuit to enable channel orthogonalization without estimating channel information.

As a high speed transmission technology of a backhaul wireless circuit and the like in a fifth generation mobile communication system, an Orbital Angular Momentum (OAM) multiplexing transmission technology attracts attentions.

The OAM multiplexing transmission technology is characterized by performing multi-stream transmission using the orbital angular momentum of an electromagnetic wave, which has not been utilized as a wireless communication unit until now.

As a power supply circuit suitable for realizing the above-described OAM multiplexing transmission technology, a method using a Butler matrix circuit in an analog circuit unit has been proposed. For example, an 8-element Butler matrix circuit formed on a planar circuit has been proposed as the analog circuit unit using the Butler matrix circuit (Non-Patent Literatures 4 and 5).

CITATION LIST

Non Patent Literature

Non-Patent Literature 1: I. E. Telatar, "Capacity of Multi-antenna Gaussian Channels", European Transactions on Telecommunications, vol. 10, pp. 585-595, 1999.

Non-Patent Literature 2: R. Kataoka, et al., "Analog Decoding Method for Simplified Short-Range MIMO Transmission", IEICE Trans. Commun., vol. E97-B, no. 3, March, 2014.

Non-Patent Literature 3: Kiyomichi ARAKI, et al., "OAM transmission as spatial multiplexing", Electronic Information Communication Engineers Vol. 100, No. 8, pp. 854-858, Issue date: 2017 Aug. 1

Non-Patent Literature 4: B. Palacin, et. al., "An 8×8 Butler Matrix for Generation of Waves Carrying Orbital Angular Momentum (OAM)", The 8th European Conference on Antennas and Propagation (EuCAP 2014), pp. 2814-2818, 2014.

Non-Patent Literature 5: B. Cetinoneri, et. al., "An 8×8 Butler Matrix in 0.13-um CMOS for 5-6-GHz Multibeam Applications", IEEE TRANSACTIONS ON MICROWAVE THEORY AND TECHNIQUES, VOL. 59, NO. 2, FEBRUARY 2011

SUMMARY OF THE INVENTION

Technical Problem

When the power supply circuit is realized by a matrix circuit such as a Butler matrix in the OAM multiplexing transmission technology, a technique of ensuring isolation between streams in the matrix circuit is important. This is because, if it is not possible to obtain isolation between streams in the matrix circuit, an interference component between the streams increases, and the transmission capacity decreases.

The isolation between the streams in the matrix circuit is caused by the deterioration of the orthogonality of the 90-degree hybrid circuit in the matrix, or electromagnetic field coupling between delay lines or between transmission lines.

As the technique of ensuring isolation between streams in a matrix circuit, a technique in which isolation between streams at 5.5 GHz being the center frequency is made to be about 11 dB by using a Butler matrix circuit (Non-Patent Literature 5). However, in the above technique, the isolation between streams at 5.3 GHz which is not the center frequency decreases to 6 dB. Thus, there is a problem in that it is not possible to ensure the isolation over a broadband frequency range.

Such a technique of realizing high speed transmission using a matrix circuit may be realized by a transmission system having a configuration illustrated in FIG. 14, in which the matrix circuit and an antenna is connected to each other by a transmission line or a cable, in many cases (Non-Patent Literature 5). In such cases, it is assumed that a one-dimensional array antenna is used as the antenna.

However, in the OAM multiplexing transmission technology, a configuration using a two-dimensional array antenna such as a ring type antenna, as the antenna is assumed. Thus, in a case where the above technology is realized by a system in FIG. 14, there are problem as follows. That is, the length, a bending method, and the like of a cable from the matrix circuit to the antenna unit vary as illustrated in FIG. 15, and the isolation between streams in a case of passing to the receiver from the transmitter may decrease.

To solve the above problems, an output terminal may be disposed at a position at which the length, the bending method, and the like of the cable from the matrix circuit to the antenna unit do not vary. However, disposing the output terminal in the matrix circuit at a desired position results in complicated wirings and makes it difficult to reduce the size of the apparatus.

In addition, there are problems in that, if the number of input terminals or output terminals in the matrix circuit increases, the number of stages of 90 hybrids forming the matrix circuit increases, and an insertion loss increases. To compensate for this loss, it is effective to dispose a transmission amplifier and a reception-side low noise amplifier between the antenna and the matrix circuit. However, in this case, there is a problem in that a component for controlling the amplifier is required, and thus it is difficult to mount the transmission amplifier and the reception-side low noise amplifier, on the identical board as a board for the matrix circuit configured by a multilayer board. Examples of the component for controlling the amplifier include a mechanism component configured to discharge heat generated in the amplifier, a circuit configured to suppress the oscillation of the amplifier, and a power supply line for the amplifier. In a case where the matrix circuit having four or more input and output terminals is mounted on a planar board, crossing wirings may be required in many cases. In this case, a method in which the wirings are crossed using a VIA hole or the like with a multilayer board in which three or more wiring layers are provided.

FIG. 16 is a diagram illustrating a specific example of a known matrix circuit having two input terminals and two output terminals. The matrix circuit is formed with a 90 degree hybrid circuit and a delay line, or a phase shifter. The wiring on the board is not complicated as long as the matrix circuit is a 2×2 matrix circuit.

FIG. 17 is a diagram illustrating a specific example of a known matrix circuit having N input terminals and N output terminals. If the matrix circuit has N terminals (N is three or more), the wiring becomes complicated, and the wirings are crossed at a plurality of locations. Thus, if the matrix circuit has N terminals (N is three or more), a multilayer board may be used in many cases.

In a case of a wave having a high frequency such as a millimeter wave, impedance matching is shifted by, for example, mounting a connector on the identical board as that for the matrix circuit, and thus a passing phase may vary largely. Thus, in order to improve the accuracy of beam forming by the antenna, for example, a variable phase shifter for compensating for phase variations may be mounted on the identical board as that for the matrix circuit. However, because the variable phase shifter requires a control voltage in many cases, it is necessary to add not only the variable phase shifter, but also the power wiring.

As described above, in a wireless communication apparatus that performs multi-stream transmission, it may be difficult to achieve both a decrease of isolation between streams and size reduction of the apparatus.

Considering the above circumstances, an object of the present disclosure is to provide a power supply circuit and a wireless device that achieve both suppression of a decrease in isolation between streams and suppression of an increase in size of the apparatus, in the wireless communication apparatus that performs multi-stream transmission.

Means for Solving the Problem

According to an aspect of the present disclosure, a circuit including a first input and output unit to which a current, a voltage, or an electromagnetic wave is applied, a second input and output unit to which a current, a voltage, or an electromagnetic wave is applied, a first board including a matrix circuit which is formed by a first microstrip line and includes a 90-degree hybrid circuit and a delay line, the first microstrip line in which one end is connected to the first input and output unit and a tip of the other end is opened, a second board including a second microstrip line in which one end is connected to the second input and output unit, and a tip of the other end is opened, and a shielding plate including an opening portion. The shielding plate causes a current, a voltage, or an electromagnetic wave directed from one end of the first microstrip line, which has the opened tip, toward the shielding plate to propagate to one end of the second microstrip line, which has the opened tip, through the opening portion and causes a current, a voltage, or an electromagnetic wave directed from the one end of the second microstrip line, which has the opened tip, toward the shielding plate to propagate to the one end of the first microstrip line, which has the opened tip, through the opening portion.

According to the aspect of the present disclosure, the circuit further includes a phase shifter configured to adjust a phase of a current, a voltage, or an electromagnetic wave excited in the second microstrip line, and a first amplifier configured to increase an amplitude of the current, the voltage, or the electromagnetic wave excited in the second microstrip line. The phase shifter is connected to the second microstrip line, and the first amplifier is connected to the second microstrip line.

According to the aspect of the present disclosure, the circuit further includes a housing including the first board, the second board, and the shielding plate in the housing. The housing includes a shielding portion configured to shield an electromagnetic wave generated by the current, the voltage, or the electromagnetic wave excited in the first microstrip line and the second microstrip line, and a non-shielding portion configured not to shield the current, the voltage, or the electromagnetic wave excited in the first microstrip line and the second microstrip line. The second input and output unit emits the electromagnetic wave to an outside of the housing through the non-shielding portion.

According to the aspect of the present disclosure, the circuit further includes a second amplifier configured to adjust the amplitude of the current, the voltage, or the electromagnetic wave excited in the second microstrip line. The second amplifier is connected to a preceding stage of the phase shifter.

According to the aspect of the present disclosure, in the circuit, the first board, the shielding plate, and the second board are substantially parallel to each other.

According to the aspect of the present disclosure, in the circuit, the second input and output unit is connected to an antenna element configured to emit a predetermined electromagnetic wave, and an arrangement of the second input and output unit is substantially identical to an arrangement of the element.

According to another aspect of the present disclosure, a wireless device includes the above circuit.

Effects of the Invention

According to the present disclosure, it is possible to provide a circuit and a wireless device that achieve both suppression of a decrease in isolation between streams and suppression of an increase in size of the apparatus in the wireless communication apparatus that performs multi-stream transmission.

DESCRIPTION OF EMBODIMENTS

First Embodiment

Figure 1:
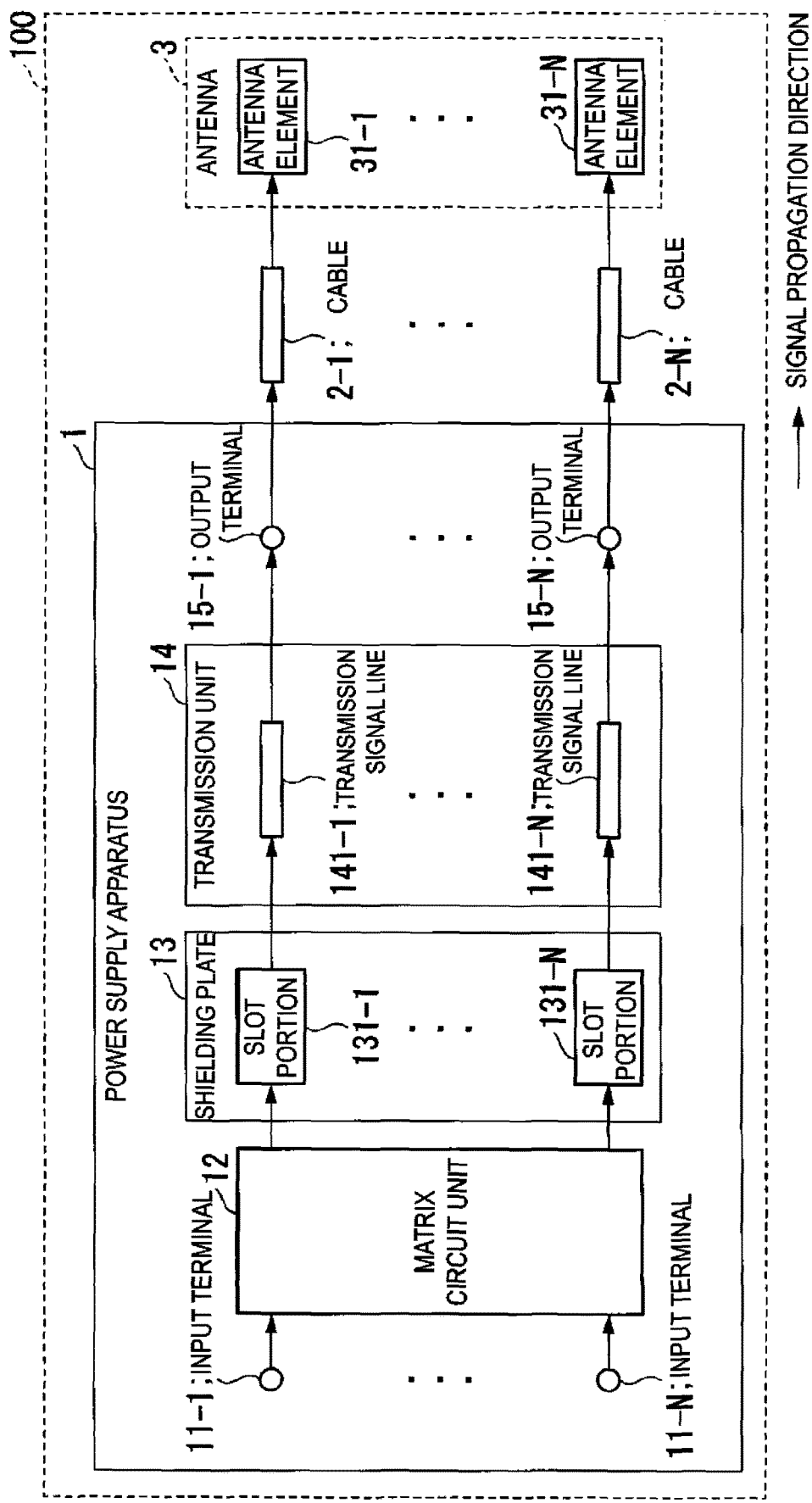
FIG. 1 is a diagram illustrating a specific example of a functional configuration of a wireless device 100 according to a first embodiment.

FIG. 1 is a diagram illustrating a specific example of a functional configuration of a wireless device 100 according to a first embodiment. The wireless device 100 includes a power supply apparatus 1, a cable 2, and an antenna 3. If a current, a voltage, or an electromagnetic wave having a first amplitude waveform and a first phase waveform is applied, the power supply apparatus 1 applies a current, a voltage, or an electromagnetic wave having a second amplitude waveform and a second phase waveform, to the cable 2. The amplitude waveform is a waveform that indicates a change in amplitude over time. The phase waveform is a waveform that indicates a change in phase over time. A signal in which a current having the first amplitude waveform and the first phase waveform is used as a transmission medium is referred to as a first signal below. A signal in which a current having the second amplitude waveform and the second phase waveform is used as a transmission medium is referred to as a second signal below.

The power supply apparatus 1 includes input terminals 11-1 to 11-N (N is an integer of 1 or greater), a matrix circuit unit 12, a shielding plate 13, a transmission unit 14, and output terminals 15-1 to 15-N (N is an integer of 1 or greater). The input terminals 11-1 to 11-N are referred to as an input terminal 11 below so long as the input terminals are not distinguished from each other. An output terminal 15 is referred to as the output terminal 15 so long as the output terminals are not distinguished from each other.

The current, the voltage, or the electromagnetic wave having first amplitude waveform and the first phase waveform is applied to the input terminal 11. The amplitude waveform or the phase waveform of the first signal applied to the input terminal 11 may not be identical to the amplitude waveform or the phase waveform at each input terminal 11, or may be different for each input terminal 11.

The matrix circuit unit 12 includes a matrix circuit including circuits such as a 90-degree hybrid circuit or a delay line. The matrix circuit unit converts the first amplitude waveform and the first phase waveform of the first signal applied to each input terminal 11 into a predetermined amplitude waveform and a predetermined phase waveform for each first signal. The first signal converted by the matrix circuit unit 12 into the predetermined amplitude waveform or the phase waveform is a second signal. The matrix circuit unit 12 outputs the second signal to the shielding plate 13.

The shielding plate 13 is a shielding plate having slot portions 131-1 to 131-N. The slot portion 131 is an opening opened in the shielding plate 13. The shielding plate 13 transmits the second signal output by the matrix circuit unit 12 to the transmission unit 14 by the slot portions 131-1 to 131-N. Specifically, the slot portion 131-M (M is an integer of 1 to N) transmits the second signal obtained in a manner that the first signal applied to the input terminal 11-M is converted by the matrix circuit unit 12, to the transmission unit 14.

The slot portions 131-1 to 131-N are referred to as the slot portion 131 below so long as the slot portions 131-1 to 131-N are not distinguished from each other.

The transmission unit 14 includes a transmission line and a delay line. The transmission unit acquires the second signal transmitted by the shielding plate 13, and transmits the second signal to the output terminal 15. The transmission unit 14 includes transmission signal lines 141-1 to 141-N. The transmission signal lines 141-1 to 141-N form the transmission line and the delay line, to acquire the second signal transmitted by the shielding plate 13, and to transmit the second signal to the output terminal 15. Specifically, the transmission signal line 141-M forms the transmission line and the delay line, to transmit the second signal obtained in a manner that the first signal applied to the input terminal 11-M is converted by the matrix circuit unit 12. The transmission signal lines 141-1 to 141-N are referred to as a transmission signal line 141 below so long as the transmission signal lines 141-1 to 141-N are not distinguished from each other.

The second signal transmitted by the transmission unit 14 is applied to the output terminal 15. The second signal transmitted by the transmission signal line 141-M is applied to the output terminal 15-M.

The cable 2 is used for transmitting an antenna control signal supplied by the power supply apparatus 1 to the antenna 3. Specifically, a cable 2-M is used for transmitting the second signal obtained in a manner that the first signal applied to the input terminal 11-M is converted by the matrix circuit unit 12. The cable 2 is connected to the output terminal 15 by a predetermined connector.

The antenna 3 includes a plurality of antenna elements 31-1 to 31-N which are arranged in a plane. The antenna elements 31-1 to 31-N are elements of the antenna 3. The antenna element 31-M emits an electromagnetic wave related in the Maxwell manner by the current, the voltage, or the electromagnetic wave being a transmission medium of the second signal obtained in a manner that the first signal applied to the input terminal 11-M is converted by the matrix circuit unit 12. The antenna 3 functions as an array antenna in a two-dimensional arrangement, that emits electromagnetic waves in a predetermined emission pattern in a manner that the antenna elements 31-1 to 31-M emit the electromagnetic wave in synchronization with each other.

Figure 2:
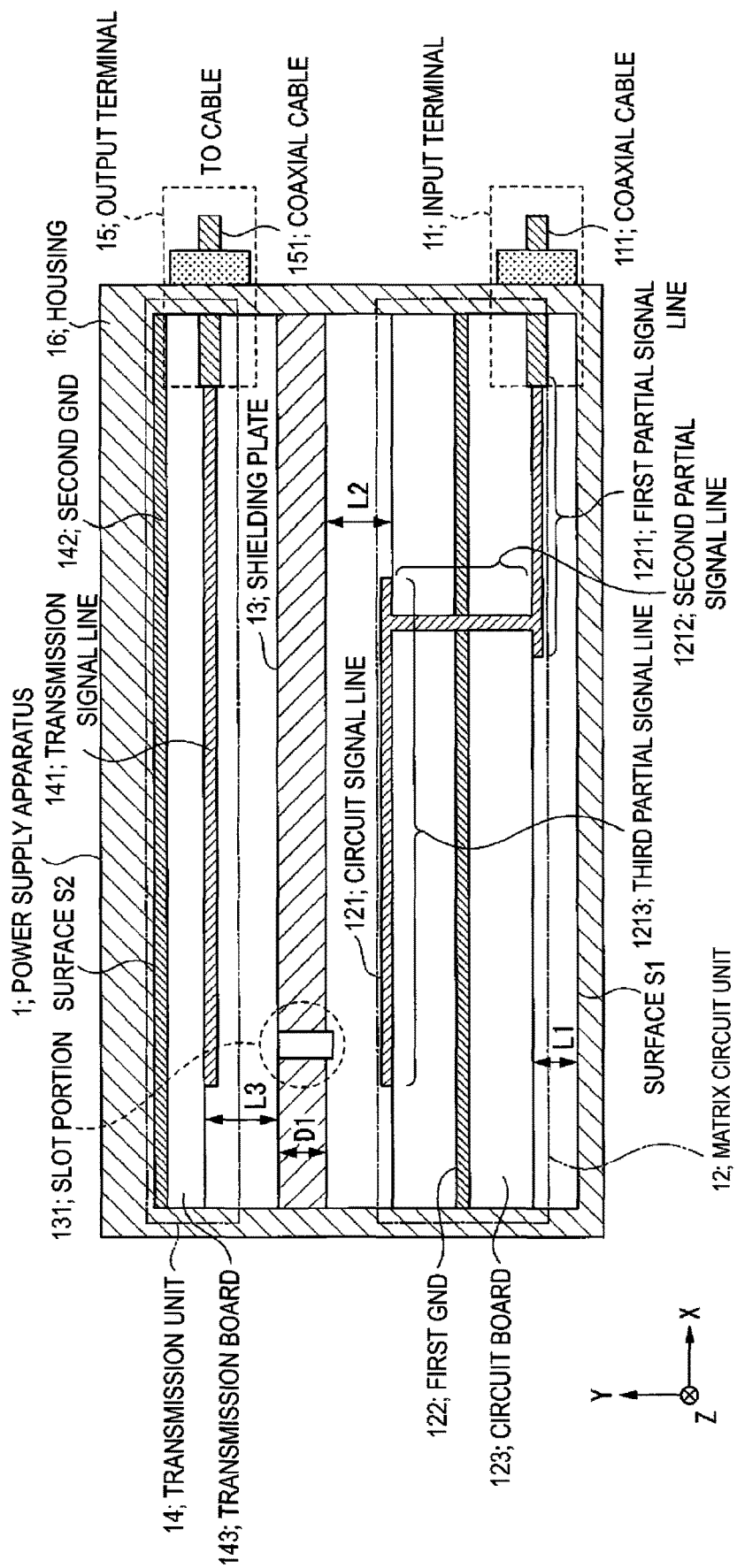
FIG. 2 is a diagram illustrating a specific example of a cross-section of a power supply apparatus 1 in the first embodiment.

FIG. 2 is a diagram illustrating a specific example of a cross-section of the power supply apparatus 1 in the first embodiment.

The power supply apparatus 1 includes the input terminal 11, the matrix circuit unit 12, the shielding plate 13, the transmission unit 14, the output terminal 15, and a housing 16. The input terminal 11 includes a coaxial cable 111. The coaxial cable 111 is used for transmitting the first signal to the matrix circuit unit 12.

The matrix circuit unit 12 includes a circuit signal line 121, a first Ground (GND) 122, and a circuit board 123. The circuit signal line 121 is a microstrip line having an opened tip. The circuit signal line 121 forms a circuit that converts the first signal into the second signal. The circuit signal line 121 includes a first partial signal line 1211, a second partial signal line 1212, and a third partial signal line 1213. One end of the first partial signal line 1211 is connected to the coaxial cable 111, and the other end of the first partial signal line is connected to the second partial signal line 1212. One end of the second partial signal line 1212 is connected to the first partial signal line 1211, and the other end of the second partial signal line is connected to the third partial signal line 1213. One end of the third partial signal line 1213 is connected to the second partial signal line 1212, and the other end of the third partial signal line has an opened tip. An electromagnetic wave is emitted from the end of the third partial signal line 1213, which has an opened tip, by the first signal.

The first GND 122 has a voltage which is approximately equal to 0.

The circuit board 123 is formed of a material which causes the first signal not to flow in the material. The circuit board supports the circuit signal line 121 and the first GND 122. The circuit board 123 is provided substantially parallel to a surface S1 of the inner wall of the power supply apparatus 1, at a position which is at a distance L1 from the surface S1. A space between the circuit board 123 and the surface S1 may be any space as long as the space does not have a mode in which an electromagnetic wave emitted by the first signal propagates from the circuit board 123 to the surface S1. For example, the space between the circuit board 123 and the surface S1 may be a space of vacuum or an air layer. In the space, the distance L1 is smaller than the half wavelength of the electromagnetic wave emitted by the first signal. For example, the space between the circuit board 123 and the surface S1 may be a space in which the distance L1 is smaller than the half of a wavelength of the electromagnetic wave emitted by the first signal in the material in a first space of the electromagnetic wave. For example, the space between the circuit board 123 and the surface S1 may be a space filled with a material having a dielectric constant which causes the electromagnetic wave emitted by the first signal not to be transmitted through the space.

The circuit board 123 includes the first partial signal line 1211 on a first surface and the third partial signal line 1213 on a second surface on an opposite side of the first surface. The circuit board 123 includes a VIA hole as the second partial signal line 1212. Thus, the first partial signal line 1211 and the third partial signal line 1213 are connected to each other by the VIA hole. The circuit board 123 includes the first GND 122 between the first partial signal line 1211 and the third partial signal line 1213, to be substantially parallel to the first partial signal line 1211 and the third partial signal line 1213. The first GND 122 is at a position which is substantially identical to the center position of the circuit board 123.

The shielding plate 13 is a plate-like material having a thickness of D1. The shielding plate 13 includes the slot portion 131 as described above. The slot portion 131 is an opening portion opened in a direction perpendicular to a surface including the third partial signal line 1213 in the circuit board 123. The electromagnetic wave emitted by the third partial signal line 1213 propagates through the slot portion 131. A portion (referred to as "a non-opening portion" below) of the shielding plate 13, which is not the opening portion shields an electromagnetic wave emitted by the third partial signal line 1213. The shielding plate 13 is provided at a position of a distance L2 from the surface including the third partial signal line 1213 in the circuit board 123, to be substantially parallel to the circuit board 123.

A DC component of the electromagnetic wave does not pass through the slot portion 131 configured in the above-described manner. However, in a case of a high-frequency signal such as a radio signal, it is possible to transmit the radio signal with low loss.

The shielding plate 13 may be any material as long as the shielding plate is a plate-like material that shields an electromagnetic wave emitted by the third partial signal line 1213 in the non-opening portion. For example, in the shielding plate 13, the non-opening portion may be made of metal. For example, the shielding plate 13 may be photonic crystal that shields an electromagnetic wave emitted by the third partial signal line 1213 in the non-opening portion. For example, the shielding plate 13 may be a metamaterial that shields an electromagnetic wave emitted by the third partial signal line 1213 in the non-opening portion.

The opening portion may not necessarily be vacuum or an air layer. For example, the opening portion may be a space filled with a material enabling an electromagnetic wave emitted by the third partial signal line 1213 to propagate in the material.

The distance L2 between the surface including the third partial signal line 1213 in the circuit board 123 and the shielding plate 13 may be any length, but the distance L2 desirably has a length as follows. It is desirable that the distance L2 has a length in which a mode of an electromagnetic wave emitted by the second signal, in which the electromagnetic wave propagates to the non-opening portion of the shielding plate 13 from the surface including the third partial signal line 1213 in the circuit board 123 is not provided. Specifically, the distance L2 is desirably equal to or smaller than the half of a wavelength in the material in the space between the shielding plate 13 and the surface including the third partial signal line 1213 in the circuit board 123, in a mode of an electromagnetic wave emitted by the second signal.

The transmission unit 14 includes the transmission signal line 141, a second GND 142, and a transmission board 143. The transmission signal line 141 is a microstrip line having an opened tip. A current, a voltage, or an electromagnetic wave is excited at one end of the transmission signal line 141, which has an opened tip, by the current, the voltage, or the electromagnetic wave which has propagated through the slot portion 131. The current, the voltage, or the electromagnetic wave excited in the transmission signal line 141 is transmitted to the coaxial cable 151. The waveform of the current, the voltage, or the electromagnetic wave excited in the transmission signal line 141 is identical to the waveform of the second signal. Thus, the current, the voltage, or the electromagnetic wave propagating in the coaxial cable 151 corresponds to the second signal. In this manner, the third partial signal line 1213 and the transmission signal line 141 are electrically connected to each other through the slot portion 131.

The second GND is in contact with a surface S2 of the inner wall of the power supply apparatus 1 on an opposite side of the surface S1. The second GND has a voltage which is approximately equal to 0.

The transmission board 143 is made of a material which causes the second signal not to flow in the material. The transmission board supports the transmission signal line 141 and the second GND 142. The transmission board 143 includes the second GND 142 on the surface on the surface S2 side. The transmission board 143 includes the transmission signal line 141 on the surface on the opposite side of the surface including the second GND 142.

The transmission board 143 is provided substantially parallel to the shielding plate 13. A distance L3 between the shielding plate 13 and a surface including the transmission signal line 141 in the transmission board 143 may be any length as long as the distance L3 satisfies an inter-board electromagnetic mode condition. The inter-board electromagnetic mode condition means a length in which a mode in which the electromagnetic wave emitted by the second signal propagates from the surface including the third partial signal line 1213 in the circuit board 123 to the surface including the transmission signal line 141 in the transmission board 143 through the opening portion of the shielding plate 13 is provided. Specifically, L3 is a length in which L2+D1+L3 is equal to or greater than the half of the wavelength of the second signal in the material.

The distance L3 between the shielding plate 13 and the surface including the transmission signal line 141 in the transmission board 143 may be any length as long as the distance L3 satisfies the inter-board electromagnetic mode condition. The distance L3 is desirably a length as follows. For example, it is desirable that the distance L3 has a length in which a mode of an electromagnetic wave emitted by the second signal, in which the electromagnetic wave propagates to the non-opening portion of the shielding plate 13 from the surface including the transmission signal line 141 in the transmission board 143 is not provided. Specifically, the distance L3 is desirably equal to or smaller than the half of a wavelength in the material in the space between the shielding plate 13 and the surface including the transmission signal line 141 in the transmission board 143, in a mode of an electromagnetic wave emitted by the second signal.

The output terminal 15 includes a coaxial cable 151. The coaxial cable 151 transmits the signal transmitted in the transmission signal line 141, to the cable 2.

The housing 16 causes electromagnetic waves generated by the first signal and the second signal does not to be transmitted to the outside. The housing 16 is a housing that surrounds the matrix circuit unit 12, the shielding plate 13, and the transmission unit 14. The housing 16 supports the matrix circuit unit 12, the shielding plate 13, and the transmission unit 14. The housing 16 may be any housing as long as the housing causes the electromagnetic waves generated by the first signal and the second signal not to be transmitted to the outside. For example, the housing 16 may be a metal housing having a dielectric constant that causes the electromagnetic waves generated by the first signal and the second signal to be shielded.

For simple description, an axis parallel to a direction perpendicular to the paper surface in FIG. 2 is set as a Z-axis. Description will be made using XYZ axis coordinates of the left-hand system, in which an axis parallel to a direction perpendicular to the surface including the third partial signal line 1213 in the circuit board 123 is set to a Y-axis, and an axis orthogonal to the Z-axis and the Y-axis is set to an X-axis. The positive direction of the Z-axis is a direction from the front of the paper surface toward the back side. The positive direction of the Y-axis is a direction from the surface including the third partial signal line 1213 in the circuit board 123 toward the shielding plate 13.

A position relation between the third partial signal line 1213, the slot portion 131, and the transmission signal line 141 in the embodiment will be described below with reference to FIG. 3 and FIG. 4.

Figure 3:
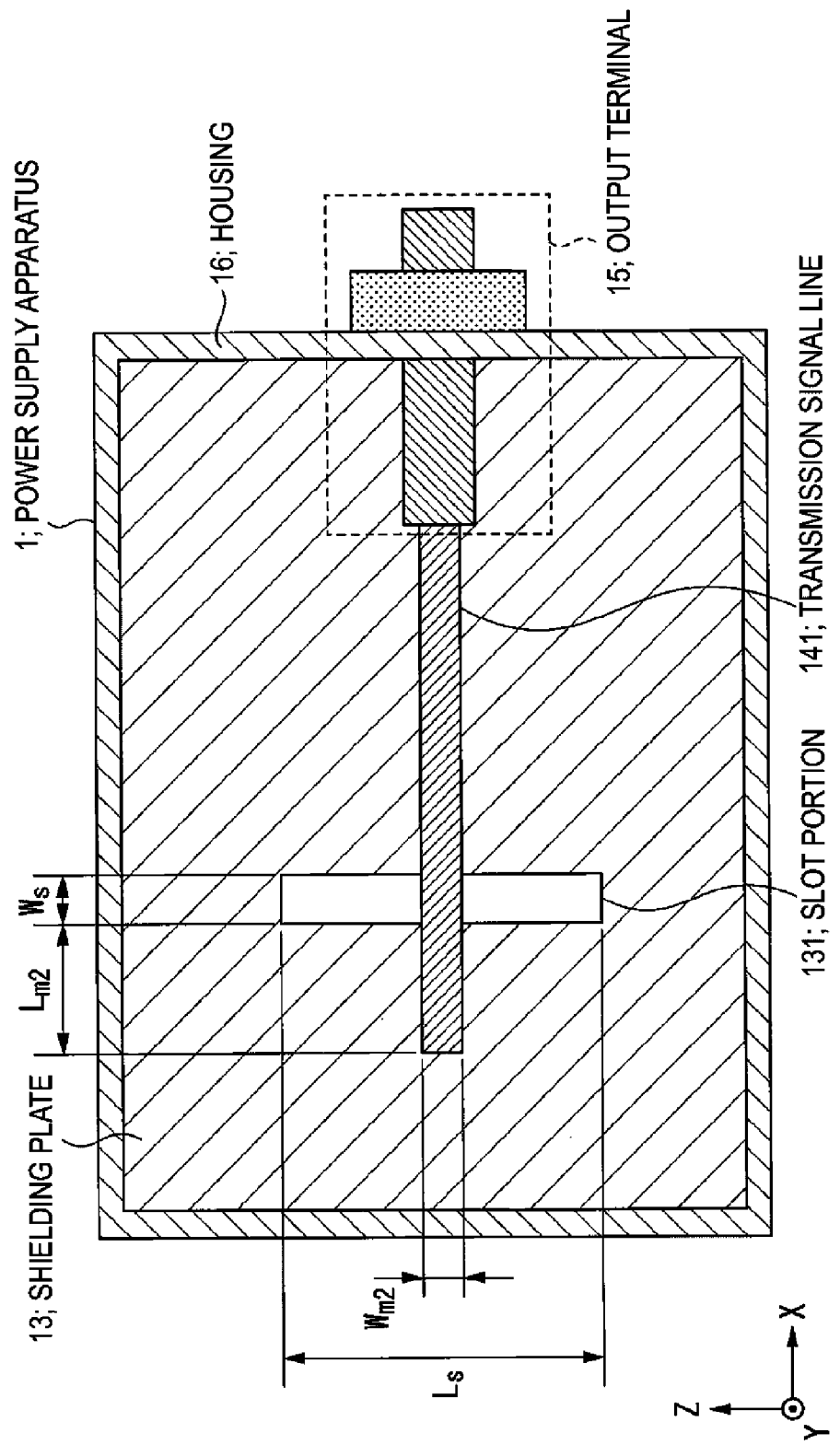
FIG. 3 is a diagram illustrating a position relation between a slot portion 131 and a transmission signal line 141 in the first embodiment.

FIG. 3 is a diagram illustrating a position relation between the slot portion 131 and the transmission signal line 141 in the first embodiment. FIG. 3 is a view when the slot portion 131 and the transmission signal line 141 are viewed from the Y-axis positive direction. The slot portion 131 and the transmission signal line 141 have a cuboid shape. The slot portion 131 and the transmission signal line 141 have a position relation of being orthogonal to each other when viewed from the Y-axis positive direction. The slot portion 131 has a length Ws in a direction parallel to a long axis of the transmission signal line 141, and has a length Ls in a direction perpendicular to the transmission signal line 141. The lengths Ws and Ls satisfy a relation of Ls>Ws. The length of the transmission signal line 141 in a direction parallel to a long axis of the slot portion 131 is Wm2. When viewed from the Y-axis positive direction, the slot portion 131 and the transmission signal line 141 overlap each other at a distance Lm2 from the open end of the transmission signal line 141.

Figure 4:
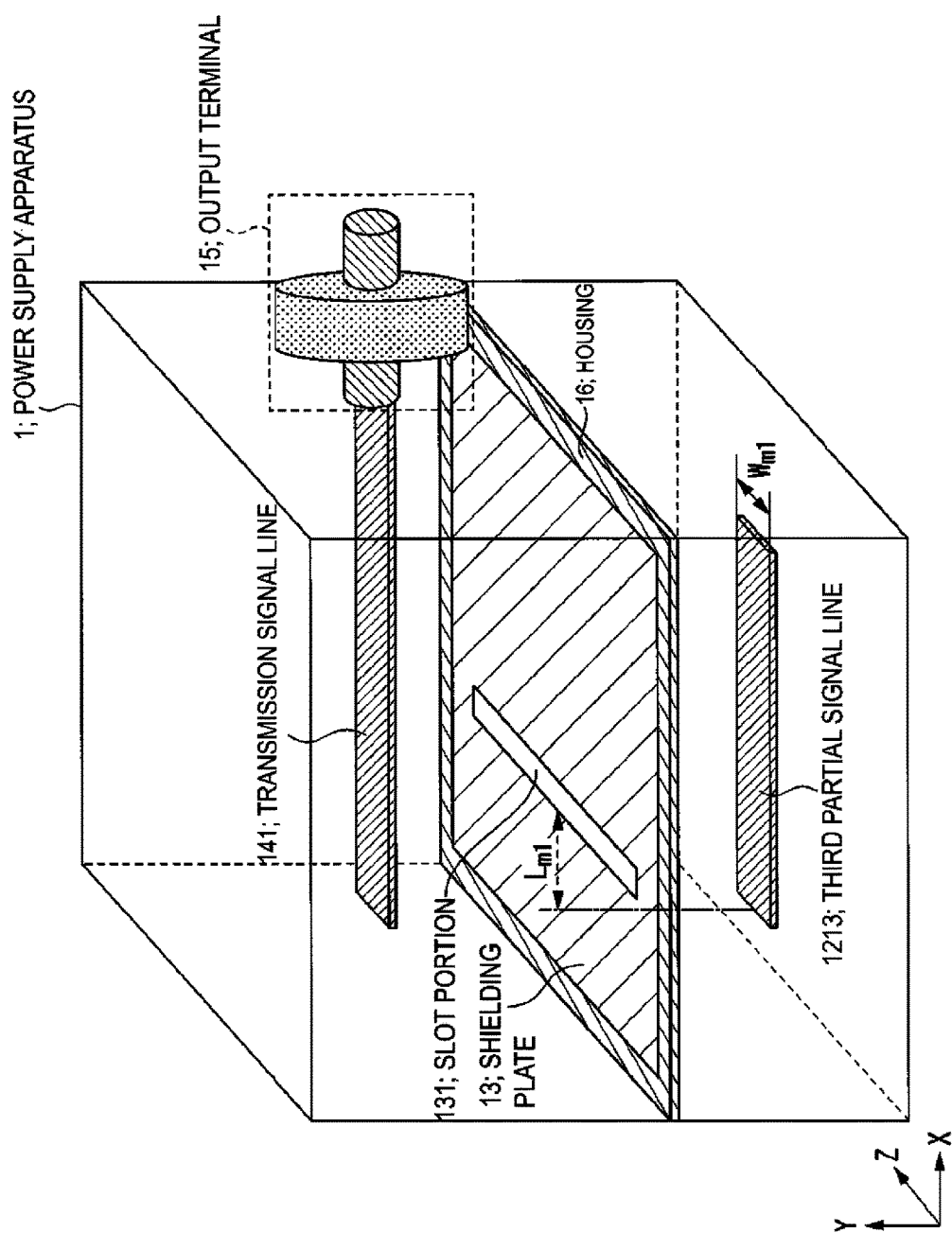
FIG. 4 is a diagram illustrating a position relation between the slot portion 131 and a third partial signal line 1213 in the first embodiment.

FIG. 4 is a diagram illustrating a position relation between the slot portion 131 and the third partial signal line 1213 in the first embodiment. The third partial signal line 1213 has a cuboid shape. The third partial signal line 1213 and the slot portion 131 have a position relation of being orthogonal to each other when viewed from the Y-axis positive direction. The length of the third partial signal line 1213 in a direction parallel to a long axis of the slot portion 131 is Wm1. When viewed from the Y-axis positive direction, the slot portion 131 and the third partial signal line 1213 overlap each other at a distance Lm1 from the open end of the third partial signal line 1213 on a negative side of the X-axis direction.

The power supply apparatus 1 configured in the above-described manner includes the matrix circuit unit 12 and the transmission unit 14 which face each other in a single housing. Thus, it is possible to suppress complexity of wiring and to achieve both suppression of a decrease in isolation between streams and suppression of an increase in size of the apparatus. The isolation between the streams mean a state in which amplitude variation or phase variation between streams occurs small. The decrease in isolation between streams means that the amplitude variation or the phase variation between the streams increases.

Because the power supply apparatus 1 configured in the above-described manner includes the shielding plate 13, the space in the housing 16 is divided into at least two spaces. Thus, it is possible to suppress an occurrence of an electromagnetic wave mode in the housing 16 and to suppress the decrease in isolation between streams.

In the power supply apparatus 1 configured in the above-described manner, because the complexity of wiring is suppressed, it is possible to perform arrangement of a plurality of output terminals 15, which is substantially identical to the arrangement of the antenna element 31 in the antenna 3, while suppressing the decrease in isolation between streams.

Figure 5:
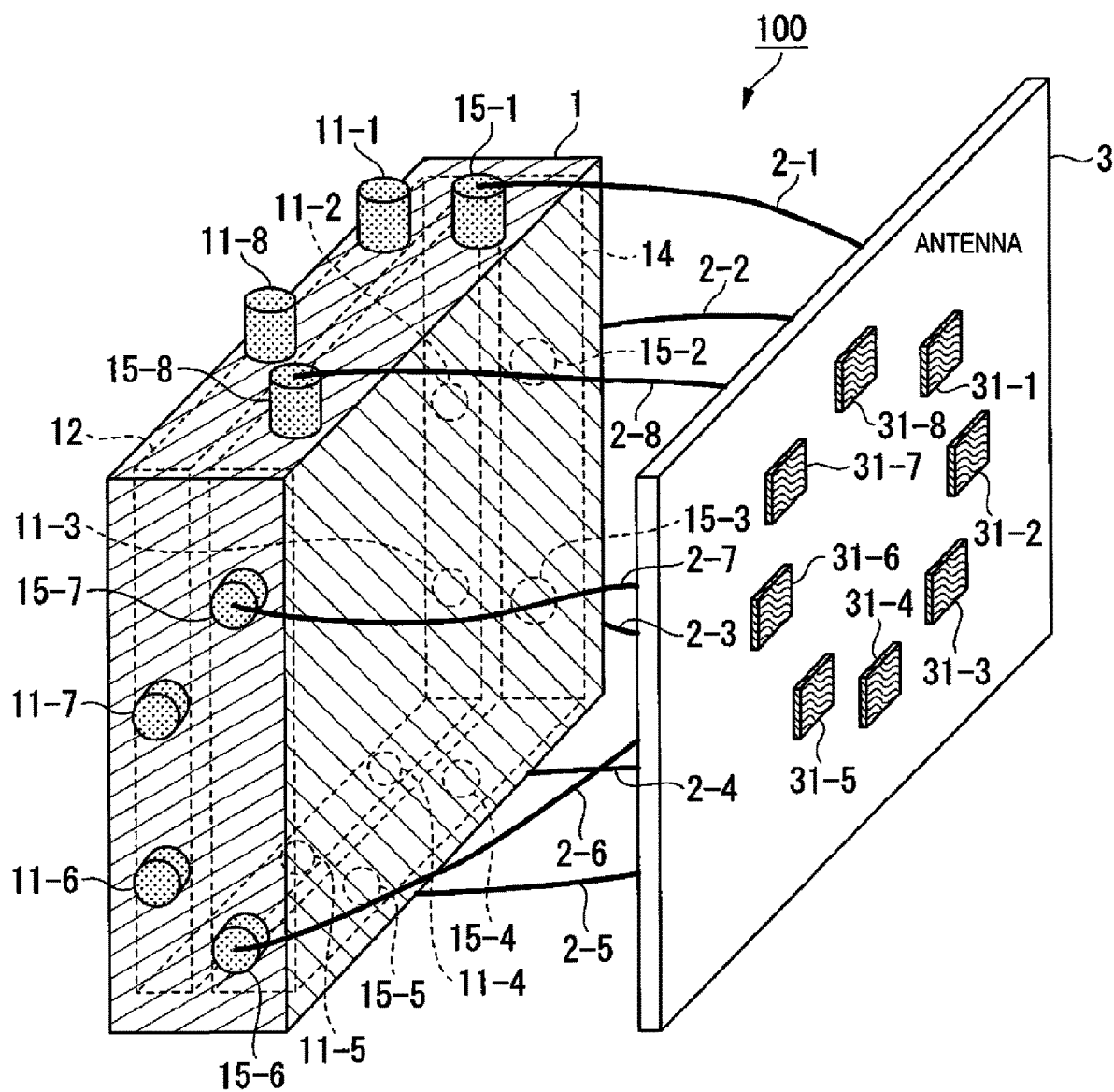
FIG. 5 is a diagram illustrating a specific arrangement of output terminals 15 in the first embodiment.

FIG. 5 is a diagram illustrating a specific arrangement of the output terminals 15 in the first embodiment. FIG. 5 illustrates the specific arrangement of the output terminals 15 in a case of N=8. The output terminals 15 are provided on the side surface of the power supply apparatus 1 in the arrangement which is substantially identical to the arrangement of the antenna element 31 in the antenna 3. Thus, the length and the bending of the cable 2-M that connects the output terminal 15-M and the antenna element 31-M are substantially identical regardless of the cable 2-M.

The wireless device 100 configured in the above-described manner includes the output terminals 15 in the arrangement which is substantially identical to the arrangement of the antenna element 31 in the antenna 3. Thus, it is possible to reduce the lead of the cable 2 and to suppress the decrease in isolation between streams, which occurs by variations of the length, the bending, and the like of the cable 2.

Second Embodiment

Figure 6:
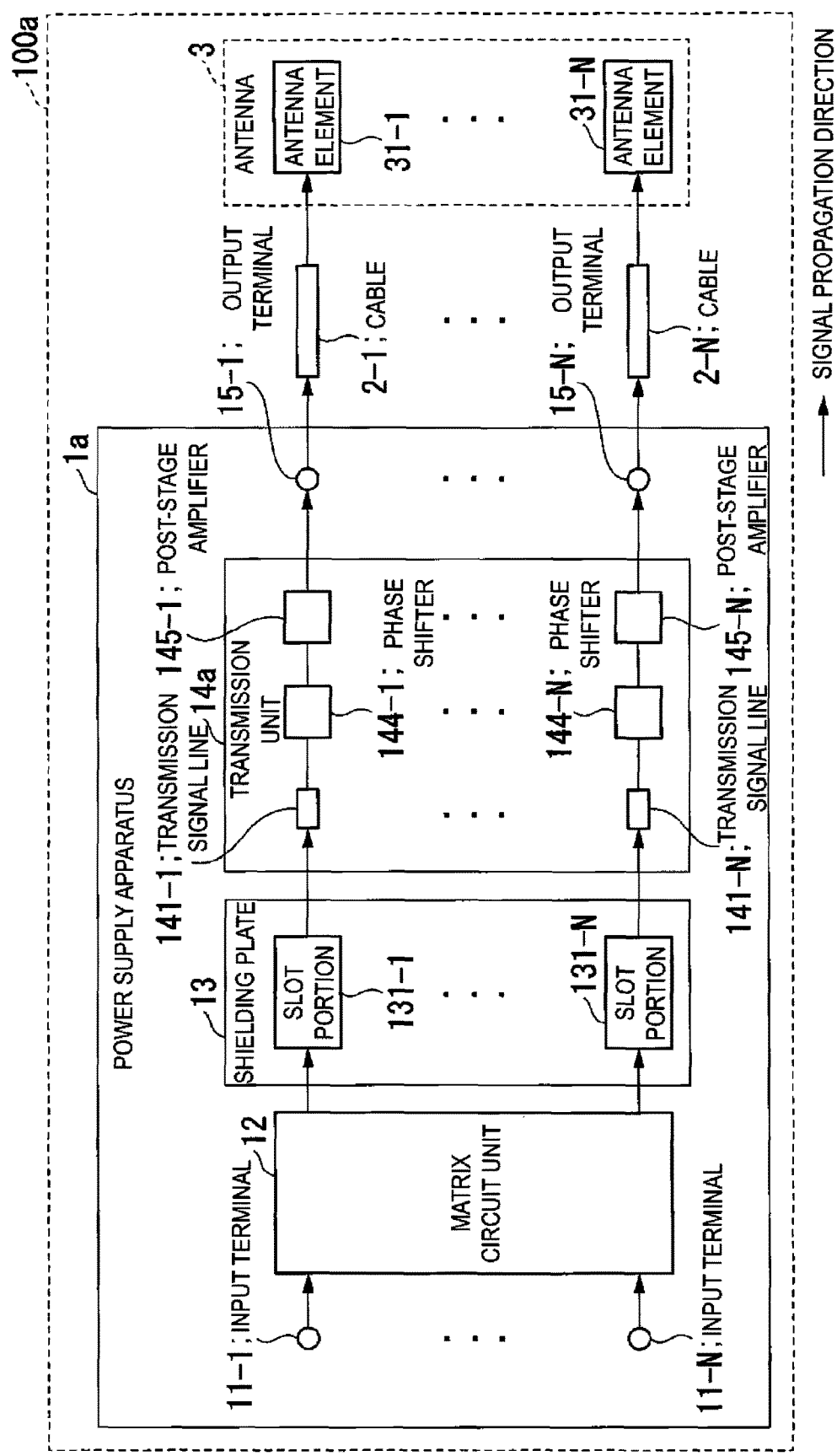
FIG. 6 is a diagram illustrating a specific example of a functional configuration of a wireless device 100a according to a second embodiment.

FIG. 6 is a diagram illustrating a specific example of a functional configuration of a wireless device 100a according to a second embodiment. The wireless device 100a is different from the wireless device 100 in the first embodiment in that the wireless device 100a includes a power supply apparatus 1a instead of the power supply apparatus 1.

The components having the similar functions to those in the wireless device 100 in the first embodiment are denoted by the similar reference signs as in FIGS. 1 to 4, and descriptions will not be repeated.

The power supply apparatus 1a is different from the power supply apparatus 1 in the first embodiment in that the power supply apparatus 1a includes a transmission unit 14a instead of the transmission unit 14. The transmission unit 14a is different from the transmission unit 14 in that the transmission unit 14a includes phase shifters 144-1 to 144-N and post-stage amplifiers 145-1 to 145-N. The phase shifter 144-M is a voltage-controlled variable phase shifter and adjusts the phase of the second signal transmitted in the transmission signal line 141-M. The post-stage amplifier 145-M is provided at the subsequent stage of the phase shifter 144-M and adjusts the amplitude of the second signal having a phase which has been adjusted by the phase shifter 144-M. The phase shifters 144-1 to 144-N are referred to as the phase shifter 144 below so long as the phase shifters 144-1 to 144-N are not distinguished from each other. The post-stage amplifiers 145-1 to 145-N are referred to as a post-stage amplifier 145 below so long as the post-stage amplifiers 145-1 to 145-N are not distinguished from each other.

Figure 7:
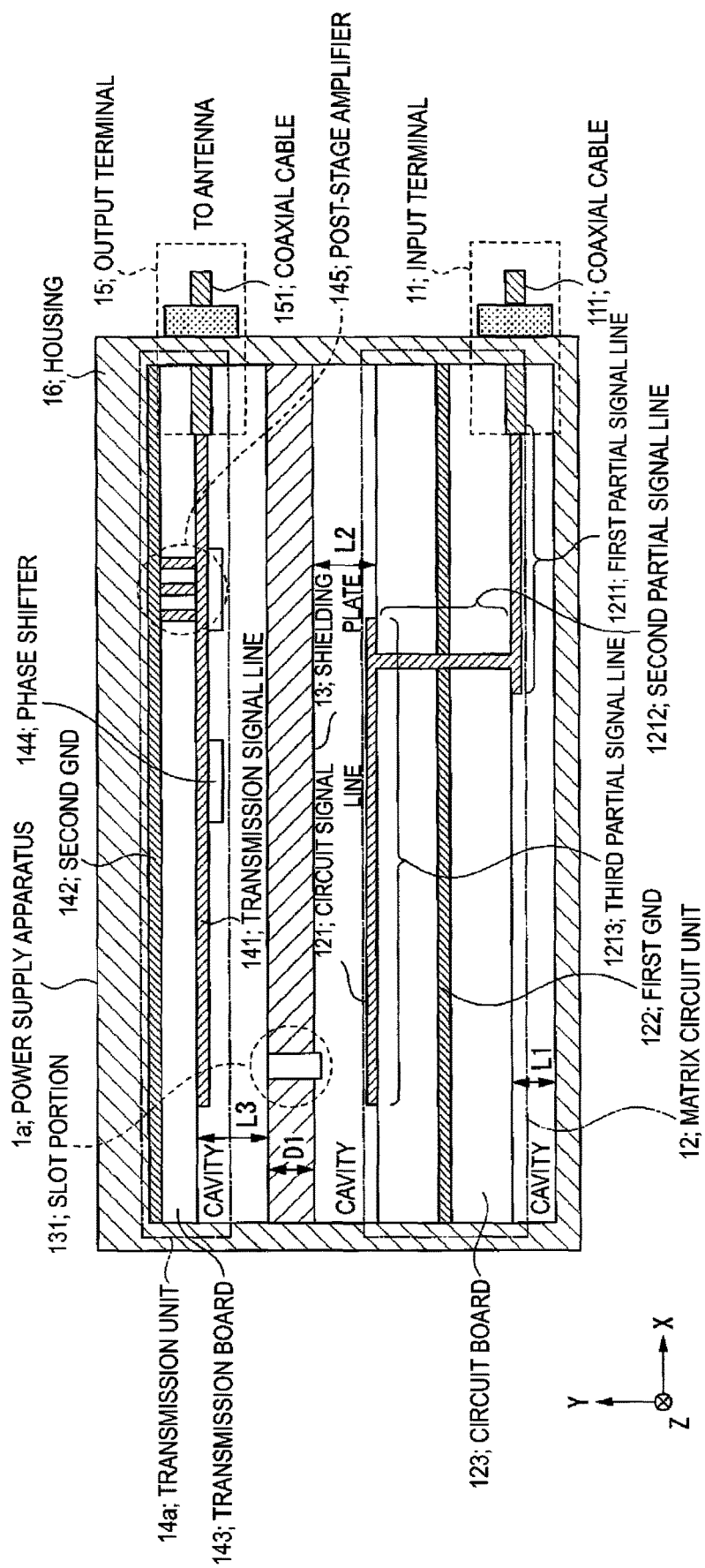
FIG. 7 is a diagram illustrating a specific example of a cross-section of a power supply apparatus 1a in the second embodiment.

FIG. 7 is a diagram illustrating a specific example of a cross-section of the power supply apparatus 1a in the second embodiment. The phase shifter 144 and the post-stage amplifier 145 are provided on the surface including a transmission signal line 141 in the transmission unit 14a.

In the power supply apparatus 1a configured in the above-described manner in the second embodiment, it is possible to compensate for the insertion loss, phase variation, and the like of the matrix circuit unit 12. Because the matrix circuit unit 12 does not include the phase shifter 144 and the post-stage amplifier 145, metal filling for heat dissipation is not required on the matrix circuit unit 12 side on which the multilayer board is often used. Because the matrix circuit unit 12 does not include the phase shifter 144 and the post-stage amplifier 145, a power source line for a control voltage, a drain voltage, or the like is not required on the matrix circuit unit 12 side.

The power supply apparatus 1a may include a heat sink 17.

Figure 8:
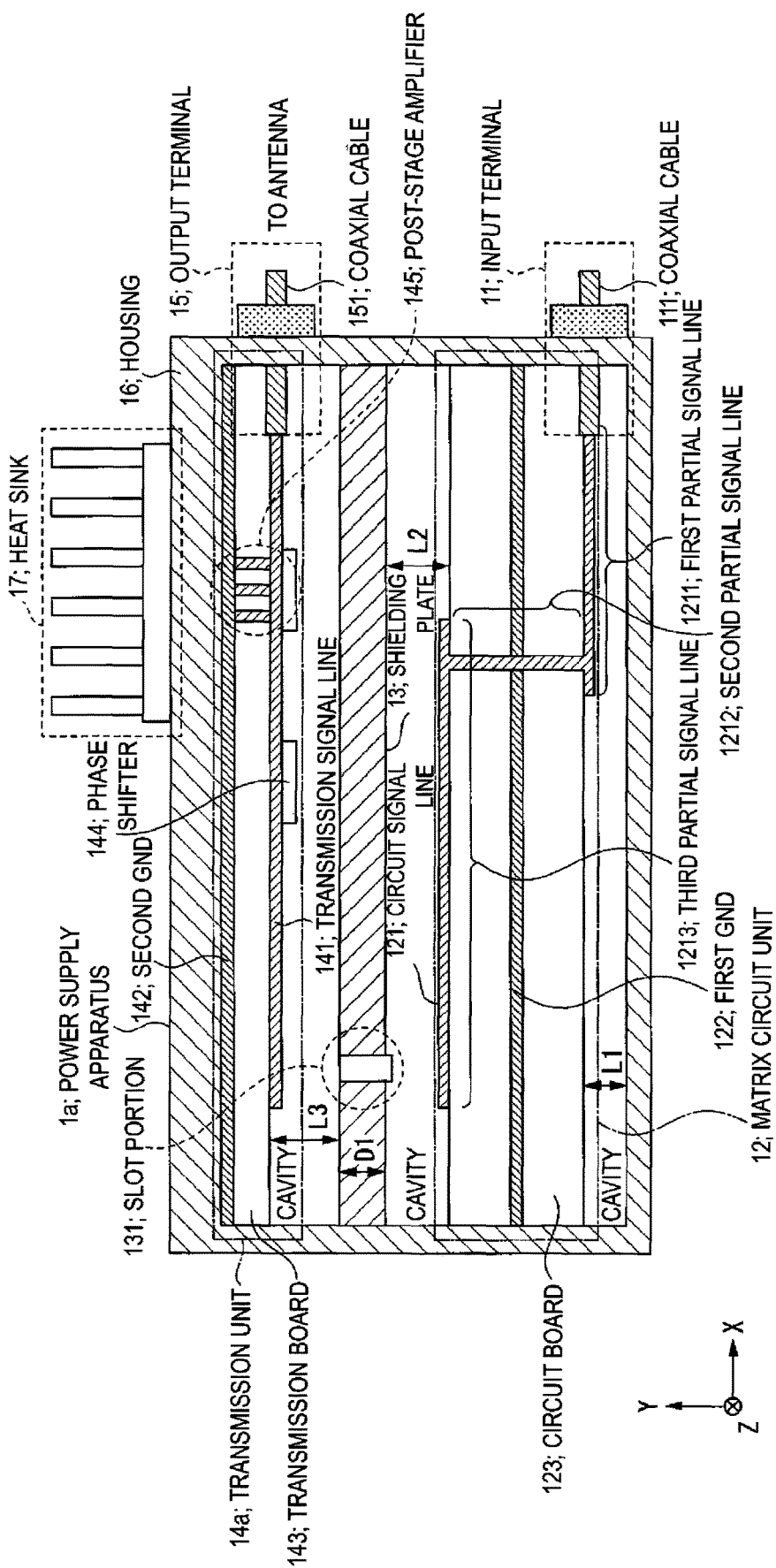
FIG. 8 is a diagram illustrating a specific example of an arrangement of a heat sink 17 in the second embodiment.

FIG. 8 is a diagram illustrating a specific example of an arrangement of a heat sink 17 in the second embodiment. The heat sink 17 is installed in the vicinity of the post-stage amplifier 145. The heat sink 17 dissipates heat generated by the post-stage amplifier 145 to the outside of the power supply apparatus 1a.

Third Embodiment

Figure 9:
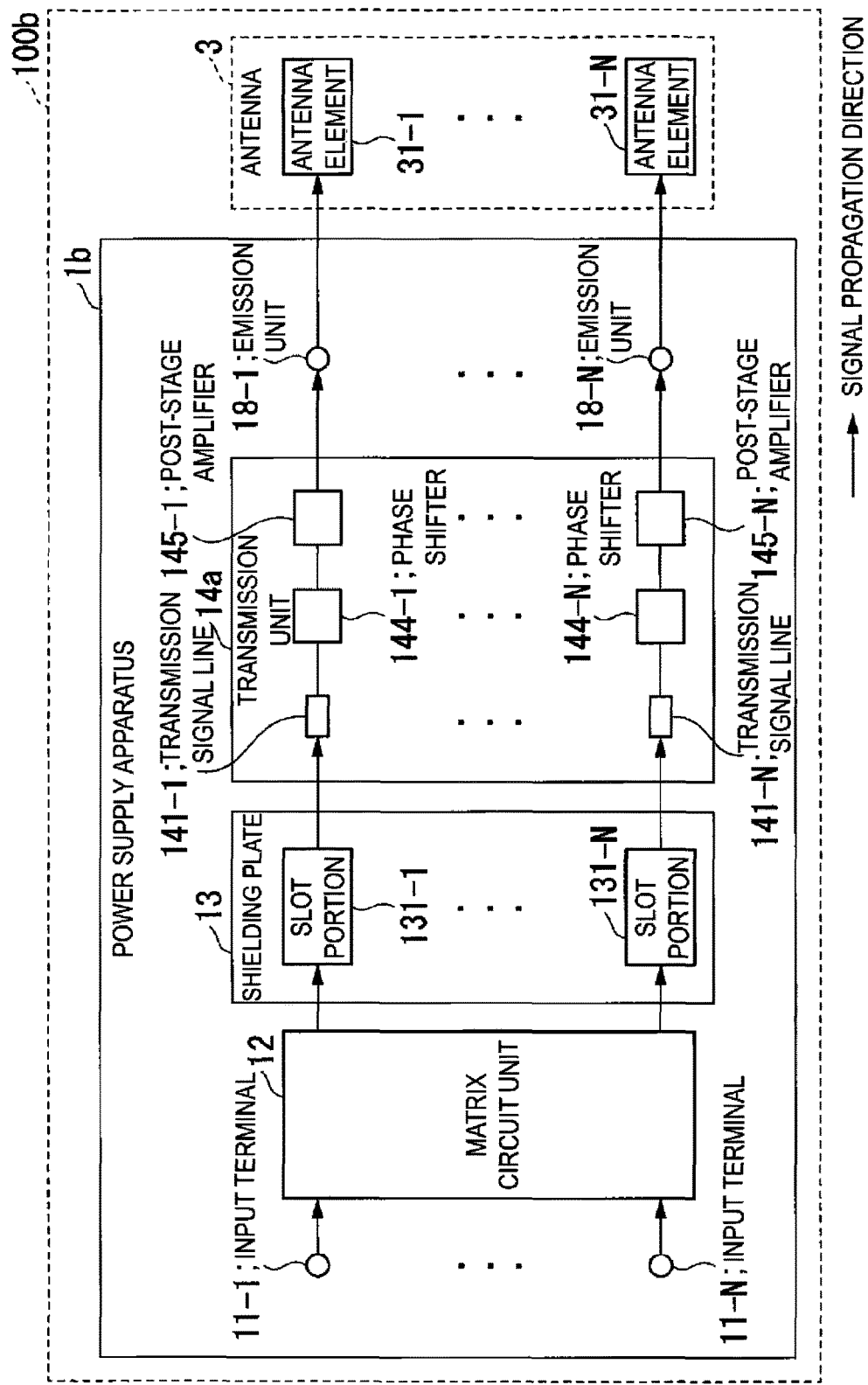
FIG. 9 is a diagram illustrating a specific example of a functional configuration of a wireless device 100b according to a third embodiment.

FIG. 9 is a diagram illustrating a specific example of a functional configuration of a wireless device 100b according to a third embodiment. A wireless device 100b is different from the wireless device 100a in that the wireless device 100b includes a power supply apparatus 1b instead of the power supply apparatus 1a. The power supply apparatus 1b is different from the power supply apparatus 1a in that the power supply apparatus 1b includes an emission unit 18 instead of the output terminal 15 and the cable 2.

The components having the similar functions to those in the wireless device 100a in the second embodiment are denoted by the similar reference signs as in FIG. 6 to FIG. 8, and descriptions will not be repeated.

The emission unit 18 transmits the second signal to the antenna element 31 by emitting the signal transmitted by the transmission signal line 141 in a form of an electromagnetic wave.

Figure 10:
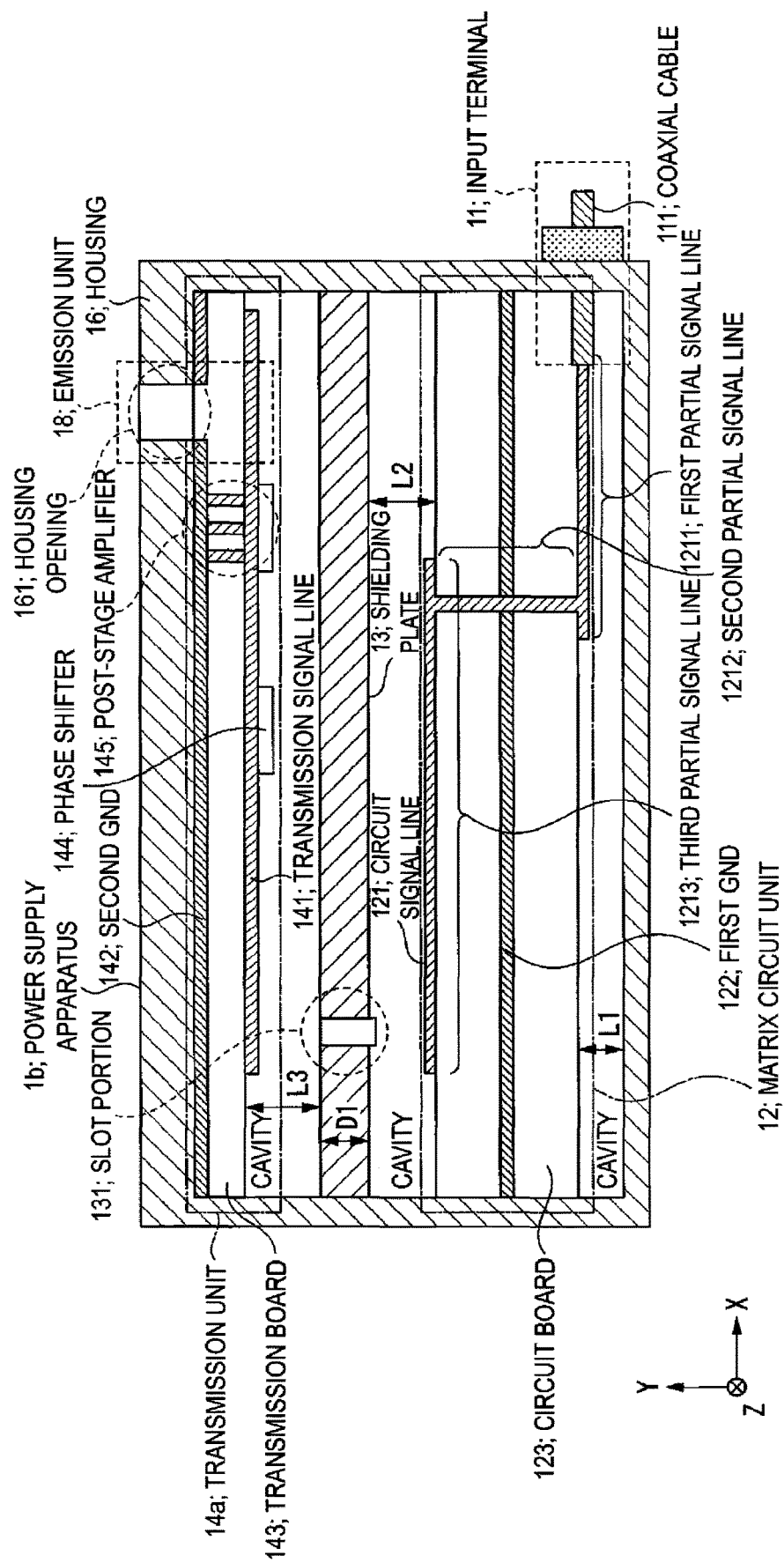
FIG. 10 is a diagram illustrating a specific example of a cross-section of a power supply apparatus 1b in the third embodiment.

FIG. 10 is a diagram illustrating a specific example of a cross-section of the power supply apparatus 1b in the third embodiment. The emission unit 18 includes a housing opening 161.

The housing opening 161 is an opening opened in housing 16. The second signal propagating in the transmission signal line 141 propagates to the outside of the power supply apparatus 1b through the housing opening 161 in a form of the electromagnetic wave.

Figure 11:
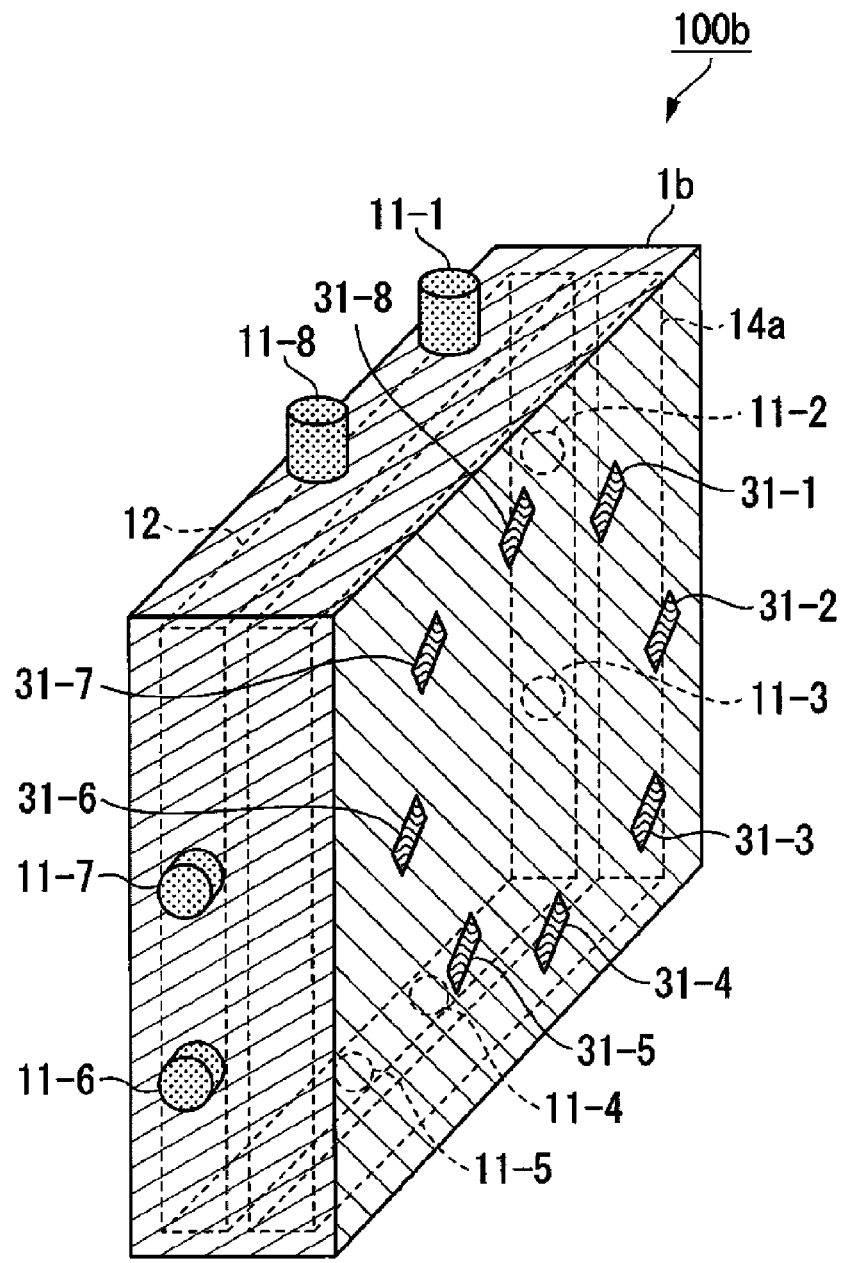
FIG. 11 is an external view illustrating an example of an overall configuration of the wireless device 100b in the third embodiment.

FIG. 11 is an external view illustrating an example of an overall configuration of the wireless device 100b in the third embodiment.

In FIG. 11, the antenna element 31 is at a position at which the emission unit 18 is provided, on the front surface of the housing 16.

In the wireless device 100b configured in the above-described manner, the second signal is transmitted to the antenna 3 through the emission unit 18. Thus, the cable between the antenna 3 and the power supply apparatus 1b is not required. Thus, compensation for amplitude variation or phase variation due to the cable is not required. In addition, because the cable is not required, it is possible to suppress an increase in cost for manufacturing the wireless device 100b.

The wireless device 100b configured in the above-described manner includes transmission signal lines 141 on a board (that is, transmission board 143) which is different from the board on which the matrix circuit unit 12 (that is, the circuit board 123) is provided. Thus, in the wireless device 100b configured in the above-described manner, it is possible to suppress leakage of an electromagnetic wave emitted from the slot portion 131 against an electromagnetic wave emitted from the emission unit 18.

Fourth Embodiment

Figure 12:
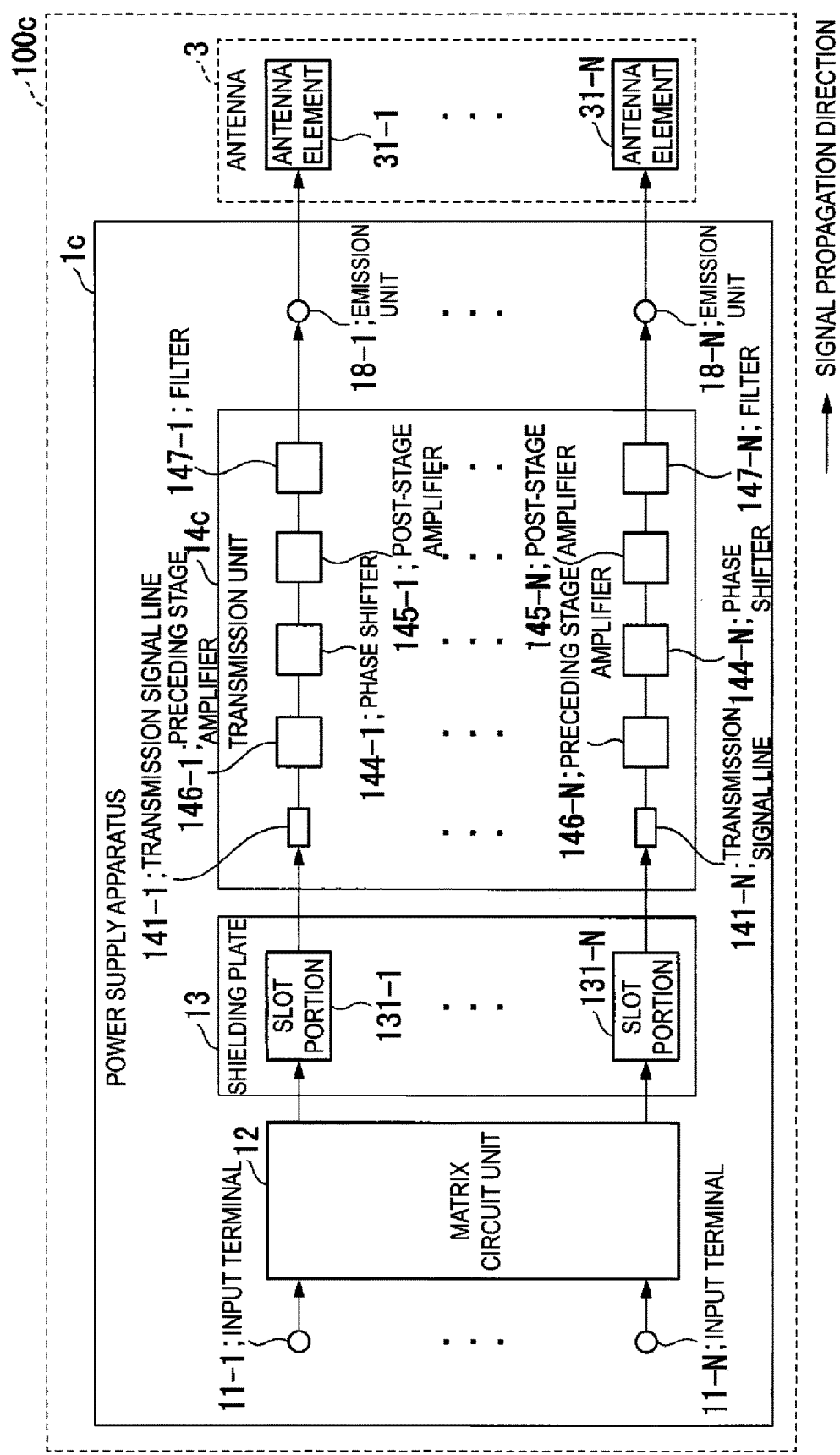
FIG. 12 is a diagram illustrating a specific example of a functional configuration of a wireless device 100c according to a fourth embodiment.
Figure 13:
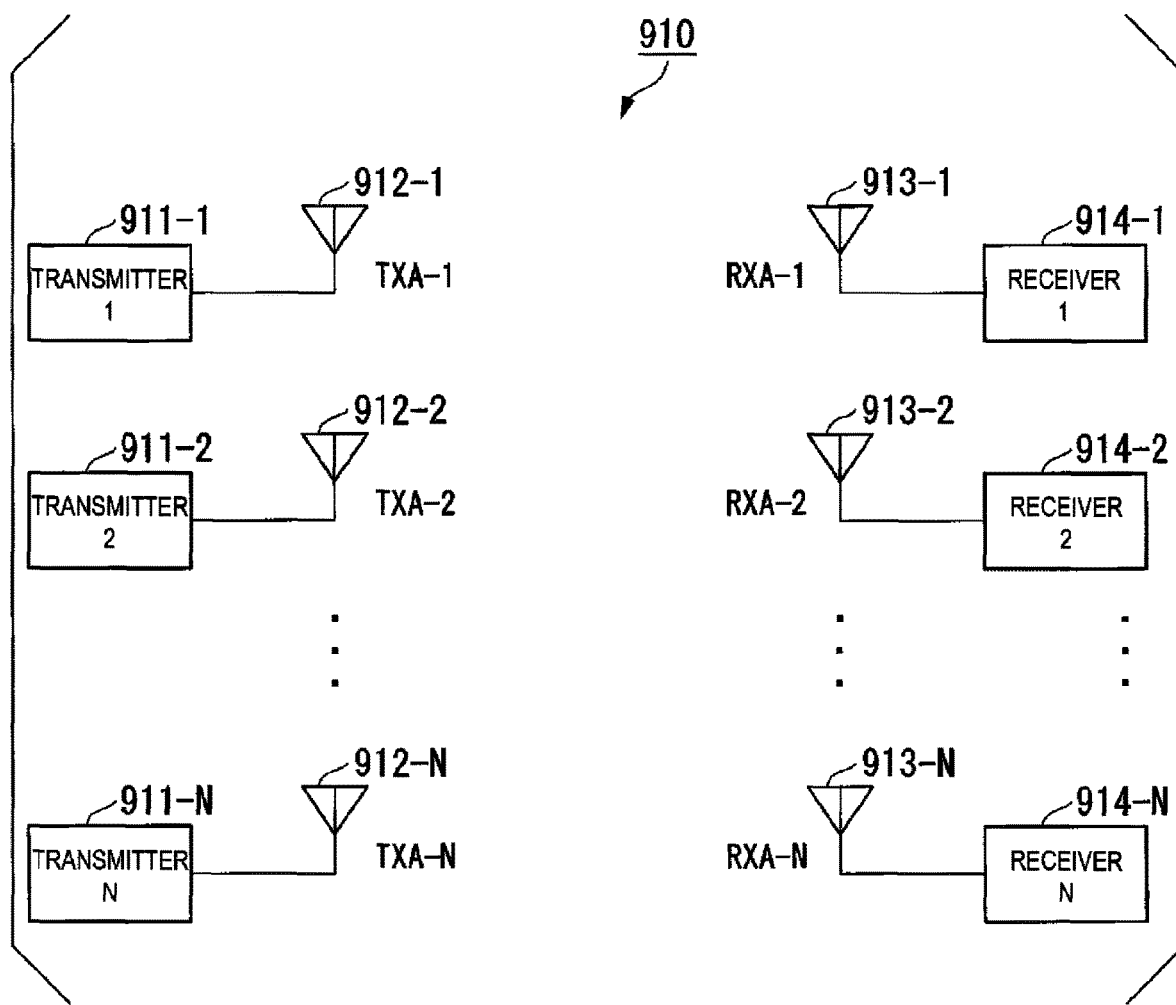
FIG. 13 is a diagram illustrating a specific example of a configuration of a MIMO transmission and reception system 900 that realizes a MIMO transmission technology.
Figure 14:
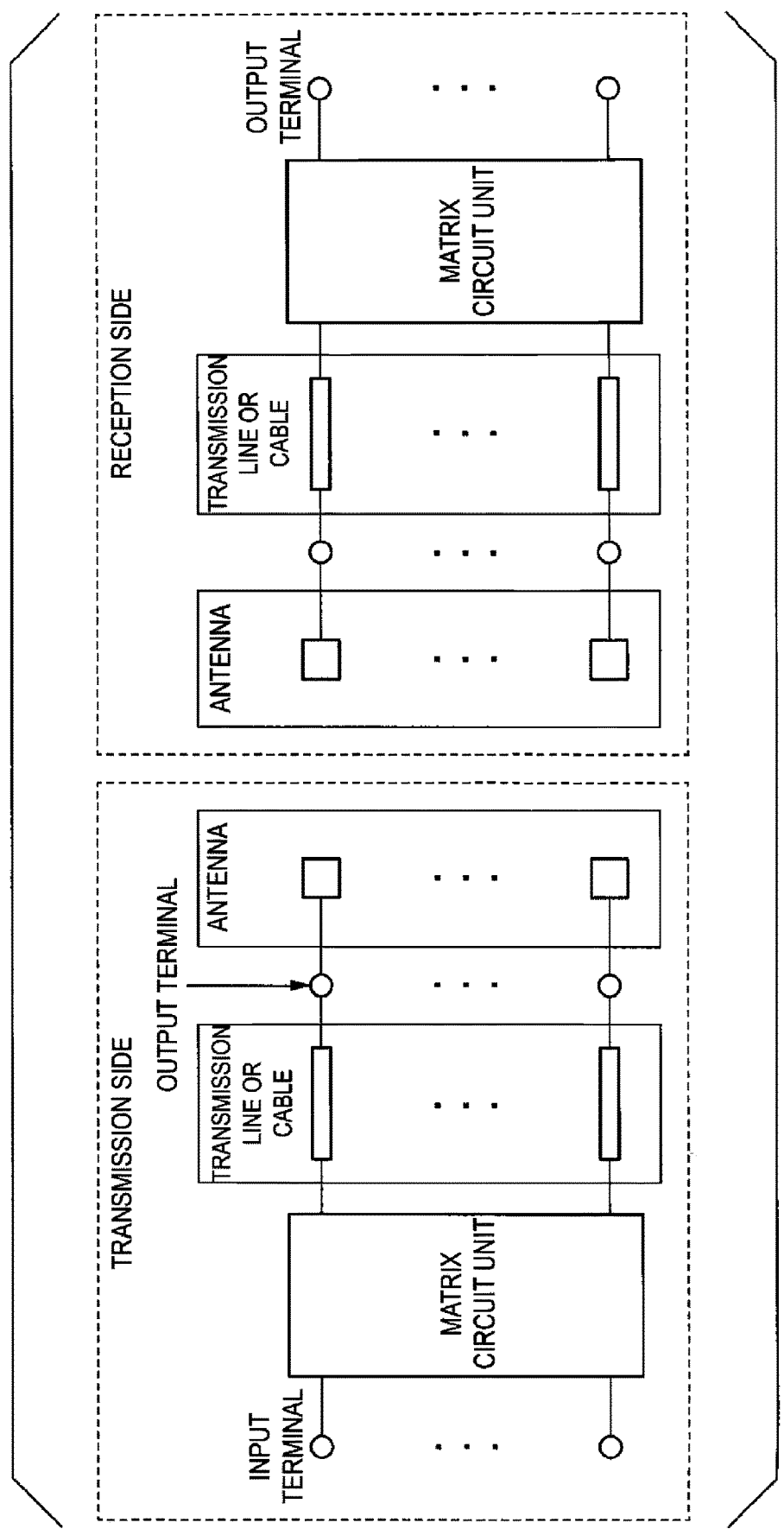
FIG. 14 illustrates a transmission system including a configuration in which a matrix circuit and an antenna are connected to each other by a transmission line or a cable.
Figure 15:
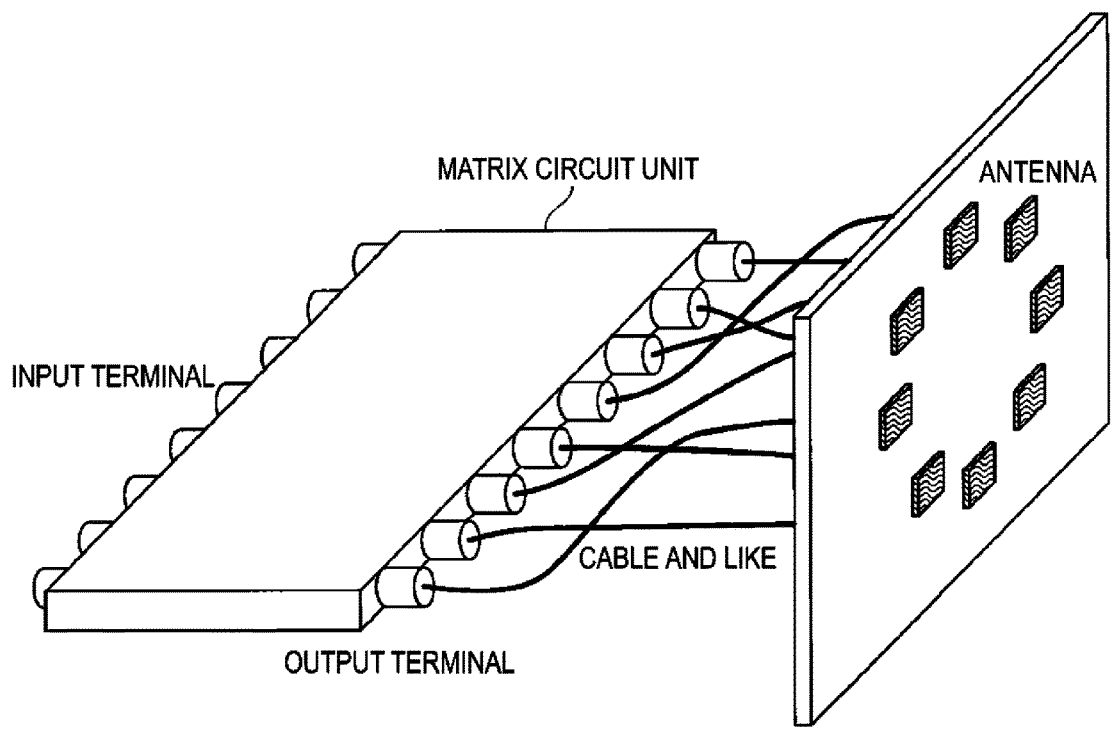
FIG. 15 is a diagram illustrating a specific example of a known wireless device.
Figure 16:
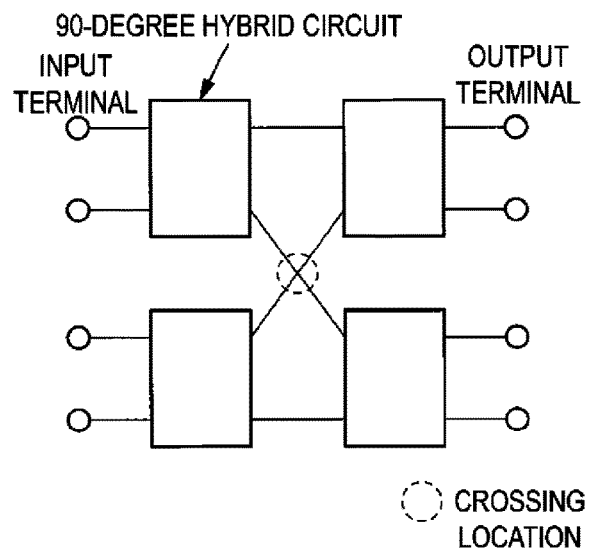
FIG. 16 is a diagram illustrating a specific example of a known matrix circuit having two input terminals and two output terminals.
Figure 17:
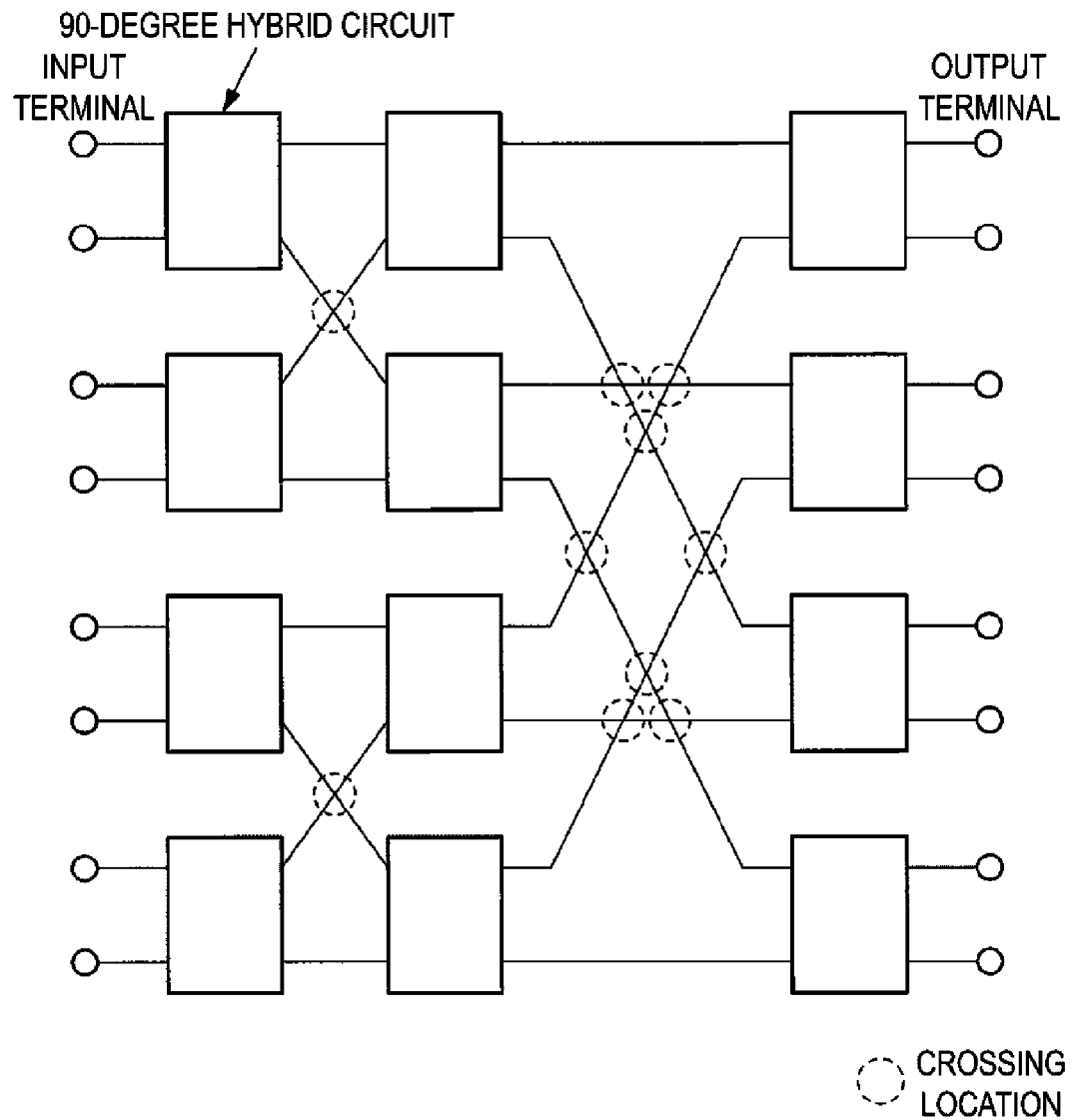
FIG. 17 is a diagram illustrating a specific example of a known matrix circuit having N input terminals and N output terminals.

FIG. 12 is a diagram illustrating a specific example of a functional configuration of a wireless device 100c according to a fourth embodiment.

A wireless device 100c is different from the wireless device 100b in that the wireless device 100c includes a power supply apparatus 1c instead of the power supply apparatus 1b. The power supply apparatus 1c is different from the power supply apparatus 1b in that the power supply apparatus 1c includes a transmission unit 14c instead of the transmission unit 14a. The transmission unit 14c is different from the transmission unit 14a in that the transmission unit 14c includes preceding stage amplifiers 146-1 to 146-N and filters 147-1 to 147-N. The preceding stage amplifiers 146-1 to 146-N are referred to as preceding stage amplifier 146 below so long as the preceding stage amplifiers 146-1 to 146-N are not distinguished from each other. The filters 147-1 to 147-N are referred to as a filter 147 below so long as the filters 147-1 to 147-N are not distinguished from each other.

The preceding stage amplifier 146 is a buffer amplifier which is provided at the preceding stage of the phase shifter 144 and adjusts the amplitude of the second signal.

The filter 147 removes an unwanted wave. The filter 147 may be any filter as long as the filter is capable of removing the unwanted wave. The filter 147 may be, for example, a waveguide filter. The filter 147 may be, for example, an isolator made of a magnetic material.

It is known that, in a case where the phase shifter 144 is a voltage-controlled variable phase shifter, the impedance between the matrix circuit unit 12 and the phase shifter 144 changes largely by the circuit configuration, and the isolation between streams in the power supply apparatus 1c is decreased.

Because the wireless device 100c configured in the above-described manner in the fourth embodiment includes the preceding stage amplifier 146, it is possible to suppress the change of impedance between the matrix circuit unit 12 and the phase shifter 144. Thus, in the wireless device 100c configured in the above-described manner in the fourth embodiment, it is possible to decrease the isolation between streams in the power supply apparatus 1c.

The transmission units 14, 14a, and 14c and the antenna 3 do not necessarily need to be connected by the cable 2, and may be connected by a waveguide. In a case where the transmission units 14, 14a, and 14c and the antenna 3 are connected by a waveguide, the second signal is transmitted with lower loss than the cable, depending on the frequency band.

The matrix circuit unit 12 does not necessarily need to be formed on a single-layer board, and may be formed on a multilayer board of two or more layers.

Although the wireless devices 100, 100a, 100b, and 100c have been described as transmitters including a power supply circuit, the wireless devices 100, 100a, 100b, and 100c may function as receivers as follows. Specifically, there are cases of replacing the input terminal and the output terminal with each other, and replacing the input and output of the amplifier with each other. In a case of replacing the input terminal and the output terminal with each other, a current, a voltage, or an electromagnetic wave is applied to the output terminal 15 and the emission unit 18, and the current, the voltage, or the electromagnetic wave is output from the input terminal 11.

In a case of replacing the input and output of the amplifier with each other, not the current, the voltage, or the electromagnetic wave flowing from one end having an opened tip to the other end, but the current, the voltage, or the electromagnetic wave flowing from the output terminal 15 and the emission unit 18 toward the opened tip of the transmission signal line 141 is input to the post-stage amplifier 145 and the preceding stage amplifier 146 in Embodiments 1 to 4.

In this case, the slot portion 131 of the shielding plate 13 causes the current, the voltage, or the electromagnetic wave to propagate from one end of the transmission signal line 141, which has an opened tip, to one end of the circuit signal line 121, which has an opened tip.

In a case where the wireless devices 100, 100a, 100b, and 100c function as receivers, the order of the phase shifter 144, and the post-stage amplifier 145 or the preceding stage amplifier 146 may be switched.

The circuit board 123 is an example of a first board. The transmission board 143 is an example of a second board. The circuit signal line 121 is an example of a first microstrip line. The transmission signal line 141 is an example of a second microstrip line. The slot portion 131 is an example of an opening portion. The output terminal 15 and the emission unit 18 are examples of the first input and output unit and the second input and output unit. The post-stage amplifier 145 is an example of a first amplifier. The preceding stage amplifier 146 is an example of a second amplifier. Portions of the housing 16 other than the housing opening 161 are an example of a shielding portion. The housing opening 161 is an example of a non-shielding portion. The input terminal 11 is an example of the first input and output unit and the second input and output unit. The power supply apparatuses 1, 1a, 1b, and 1c are examples of a circuit.

A portion of the matrix circuit unit 12 in the above-described embodiment may be realized by a computer. In this case, the function may be implemented in a manner that a program for realizing the function may be recorded on a computer readable recording medium, and the program recorded on the recording medium may be loaded into a computer system and executed. It is assumed that "the computer system" here includes an OS or hardware such as peripheral devices. "The computer readable recording medium" refers to a portable medium such as a flexible disk, a magneto-optical disk, a ROM, and a CD-ROM, and a storage device such as a hard disk mounted in a computer system. "The computer readable recording medium" may a medium that dynamically holds a program for a short period, for example, a communication line in a case where the program is transmitted via a network such as the Internet or a communication circuit line such as a telephone line; and a medium that holds a program for a predetermined period, for example, a volatile memory in a computer system as a server or a client in that case. The program may also be configured to realize some of the above-described functions, or may allow realization of the above-described functions by a combination with a program which has already been recorded in a computer system. The program may be achieved using a programmable logic device such as a Field Programmable Gate Array (FPGA).

Hitherto, the embodiments of the present disclosure have been described above in detail with reference to the drawings, but the specific configuration is not limited to the embodiments, and designs in a range without departing from the gist of the present disclosure are also included.

REFERENCE SIGNS LIST

1 Power supply apparatus
2 Cable
3 Antenna
11 Input terminal
12 Matrix circuit unit
13 Shielding plate
14 Transmission unit
15 Output terminal
16 Housing
17 Heat sink
18 Emission unit
111 Coaxial cable
121 Circuit signal line
122 First GND
123 Circuit board
141 Transmission signal line
142 Second GND
143 Transmission board
144 Phase shifter
145 Post-stage amplifier
146 Preceding stage amplifier
147 Filter
151 Coaxial cable
1211 First partial signal line
1212 Second partial signal line
1213 Third partial signal line
1a Power supply apparatus
14a Transmission unit
14c Transmission unit
161 Housing opening

The invention claimed is:

1. A circuit comprising:
a first input and output terminals to which a current, a voltage, or an electromagnetic wave is applied;
a second input and output terminals to which a current, a voltage, or an electromagnetic wave is applied;
a first board including a matrix circuit which is formed by a first microstrip line and includes a 90-degree hybrid circuit and a delay line, the first microstrip line in which one end is connected to the first input and output terminals and a tip of the other end is opened;
a second board including a second microstrip line in which one end is connected to the second input and output terminals, and a tip of the other end is opened; and
a shielding plate including an opening portion,
wherein the shielding plate causes a current, a voltage, or an electromagnetic wave directed from one end of the first microstrip line, which has the opened tip, toward the shielding plate to propagate to one end of the second microstrip line, which has the opened tip, through the opening portion and causes a current, a voltage, or an electromagnetic wave directed from the one end of the second microstrip line, which has the opened tip, toward the shielding plate to propagate to the one end of the first microstrip line, which has the opened tip, through the opening portion.

2. The circuit according to claim 1, further comprising:
a phase shifter configured to adjust a phase of a current, a voltage, or an electromagnetic wave excited in the second microstrip line; and
a first amplifier configured to increase an amplitude of the current, the voltage, or the electromagnetic wave excited in the second microstrip line,
wherein the phase shifter is connected to the second microstrip line, and
the first amplifier is connected to the second microstrip line.

3. The circuit according to claim 2, further comprising:
a housing including the first board, the second board, and the shielding plate in the housing,
wherein the housing includes
a shielding portion configured to shield the current, the voltage, or the electromagnetic wave excited in the first microstrip line and the second microstrip line, and
a non-shielding portion configured not to shield the current, the voltage, or the electromagnetic wave excited in the first microstrip line and the second microstrip line, and
the second input and output terminals emit the electromagnetic wave to an outside of the housing through the non-shielding portion.

4. The circuit according to claim 2, further comprising:
a second amplifier configured to adjust the amplitude of the current, the voltage, or the electromagnetic wave excited in the second microstrip line,
wherein the second amplifier is connected to a preceding stage of the phase shifter.

5. The circuit according to claim 1,
wherein the first board, the shielding plate, and the second board are substantially parallel to each other.

6. The circuit according to claim 1,
wherein the second input and output terminals are connected to an antenna element configured to emit a predetermined electromagnetic wave, and
an arrangement of the second input and output terminals are substantially identical to an arrangement of the element.

7. A wireless device comprising:
the circuit according to claim 1.

* * * * *